United States Patent
Lin et al.

(10) Patent No.: US 9,035,457 B2
(45) Date of Patent: May 19, 2015

(54) SUBSTRATE WITH INTEGRATED PASSIVE DEVICES AND METHOD OF MANUFACTURING THE SAME

(71) Applicant: UNITED MICROELECTRONICS CORP., Hsin-Chu (TW)

(72) Inventors: Chu-Fu Lin, Kaohsiung (TW); Ming-Tse Lin, Hsinchu (TW); Yung-Chang Lin, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 29 days.

(21) Appl. No.: 13/689,727

(22) Filed: Nov. 29, 2012

(65) Prior Publication Data

US 2014/0145326 A1    May 29, 2014

(51) Int. Cl.
| | |
|---|---|
| H01L 23/48 | (2006.01) |
| H01L 23/00 | (2006.01) |
| H01L 23/14 | (2006.01) |
| H01L 23/498 | (2006.01) |
| H01L 23/525 | (2006.01) |
| H01L 23/522 | (2006.01) |

(52) U.S. Cl.
CPC .............. *H01L 24/11* (2013.01); *H01L 23/147* (2013.01); *H01L 23/49822* (2013.01); *H01L 23/49827* (2013.01); *H01L 23/49894* (2013.01); *H01L 23/5223* (2013.01); *H01L 23/5227* (2013.01); *H01L 23/5228* (2013.01); *H01L 23/481* (2013.01); *H01L 23/525* (2013.01)

(58) Field of Classification Search
USPC ............ 257/737, E21.022, E23.145; 438/106
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato e |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |

(Continued)

*Primary Examiner* — Matthew Gordon
(74) *Attorney, Agent, or Firm* — Winston Hsu; Scott Margo

(57) ABSTRACT

A substrate with integrated passive devices and method of manufacturing the same are presented. The substrate may include through silicon vias, at least one redistribution layer having a 1st passive device pattern and stacked vias, and an under bump metal layer having a 2nd passive device pattern.

16 Claims, 8 Drawing Sheets

(56) References Cited

U.S. PATENT DOCUMENTS

| | | |
|---|---|---|
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |
| 2011/0084358 A1 | 4/2011 | Kim |
| 2011/0115050 A1* | 5/2011 | Lin .............................. 257/532 |
| 2012/0228754 A1* | 9/2012 | Liu et al. ........................ 257/676 |

* cited by examiner

SUBSTRATE WITH INTEGRATED PASSIVE DEVICES AND METHOD OF MANUFACTURING THE SAME

BACKGROUND OF THE INVENTION

1. Field of the Invention

The present invention generally relates to a substrate with integrated passive devices. More particularly, the present invention is directed to form a substrate with integrated passive devices (IPD) in an under bump metallization (UBM) layer or redistribution layers (RDL).

2. Description of the Prior Art

The rapid growth of the portable wireless electronics industry has provided numerous challenges and opportunities for the manufacturers of radio frequency (RF) components. The latest portable wireless telephony, data, and internet access products require greater functionalities, higher performances, and lower costs in smaller and lighter formats. These requirements have been partly satisfied through major advances in the integrated circuit (IC) device technology and by the introduction of smaller packaging form factors, smaller discrete passive components, and high-density interconnection printed circuit technologies.

The RF sections of the portable wireless products are built with a range of active device technologies combined with high-performance passive components. As many as ninety-five percents of the components in a typical cellular telephone product may be passive devices. In a system using high-frequency electronic components or discrete passive devices, these discrete passive devices may occupy a large portion of the circuit board area and commensurately contribute to a large share of the product assembly costs. For this reason, the so-called integrated passive device (IPD) technology is developed to prevent the increase of the circuit size and of the high-frequency characteristics.

The integrated passive devices (IPD) or the integrated passive components (IPC) are increasingly attracting due to constant needs of handheld wireless devices for further reduction in size and costs and for increase in functionalities. Many functional blocks, such as impedance matching circuits, harmonic filters, couplers, baluns or power combiners/dividers can be realized with IPD technologies. IPDs can be easily fabricated by using current conventional thin film processes and photolithography processes. They can also be designed as flip chip mountable or wire bondable components and are suitable to be fabricated on thin film substrates like silicon, glass or even on low temperature cofired ceramics (LTCC) multiplayer structures.

The IPD technologies hold great potential for significantly reducing circuit board area as well as product size and weight, and/or for allowing increased functionalities in a given product size. The result is a high performance system level solution, which provides the advantages of reduction in die size, weight, number of interconnections and system board space requirements, and can be used in many applications.

Yet challenges still remain in the field of further reduction of the IPD footprint and costs while concurrently simplifying fabrication processes and providing effective coupling and directionality. Accordingly, there is still a need for improving the design and the processes of the current IPD technology.

SUMMARY OF THE INVENTION

To further improve the design of integrated passive device (IPD), a novel substrate with integrated passive devices and a method of manufacturing the same are presented in the present invention. The substrate of present invention may include multiple passive device patterns formed directly in different structural layers, such as in under bump metal (UBM) layers, intermediate dielectric layers or redistribution layers, or on the bonding pads of a substrate after a through silicon via (TSV) process. No additional Si interposer is necessary for disposing or forming the passive device patterns. The product size can therefore be effectively reduced. Furthermore, the passive device patterns in present invention may be formed concurrently during the patterning process of under bump metals and redistribution traces or during the filling process of stacked vias, thereby reducing the steps and costs for fabricating the passive device patterns on the substrate.

One object of the present invention is to provide a substrate with integrated passive devices comprising a substrate, at least one dielectric layer formed on the substrate, a redistribution layer formed in each dielectric layer, an under bump metal layer formed on the dielectric layer, wherein the under bump metal layer comprises a first integrated passive device pattern, and bumps formed on the under bump metal layer.

Another object of the present invention is to provide a substrate with integrated passive devices comprising a substrate, at least one dielectric layer formed on the substrate, a redistribution layer formed in each dielectric layer, wherein each redistribution layer comprises an integrated passive device pattern, redistribution traces and stacked vias, an under bump metal layer formed on the dielectric layer, and bumps formed on the under bump metal layer.

Still another object of the present invention is to provide a method of manufacturing a substrate with integrated passive devices, comprising the steps of providing a substrate, forming a redistribution layer on the substrate, forming a dielectric layer on the redistribution layer, forming an under bump metal layer having a first integrated passive device pattern on the dielectric layer, and forming bumps on the under bump metal layer.

Still another object of the present invention is to provide a method of manufacturing a substrate with integrated passive devices, comprising the steps of providing a substrate, forming at least one dielectric layer on the substrate, forming a redistribution layer having an integrated passive device pattern, redistribution traces and stacked vias in each dielectric layer, forming an under bump metal layer electrically connected with said stacked vias on the dielectric layer, and forming bumps on the under bump metal layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

In the drawings.

Figure 1:
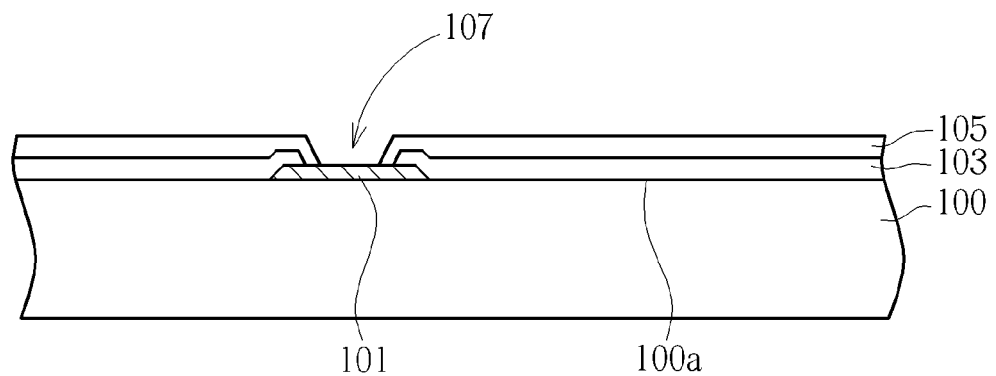
FIGS. 1-13 are cross-sectional views illustrating the process flow for manufacturing a substrate with integrated passive devices (IPD) formed in redistribution layers (RDL) and in an under bump metallization (UBM) in accordance with the second embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention.

Figure 13:
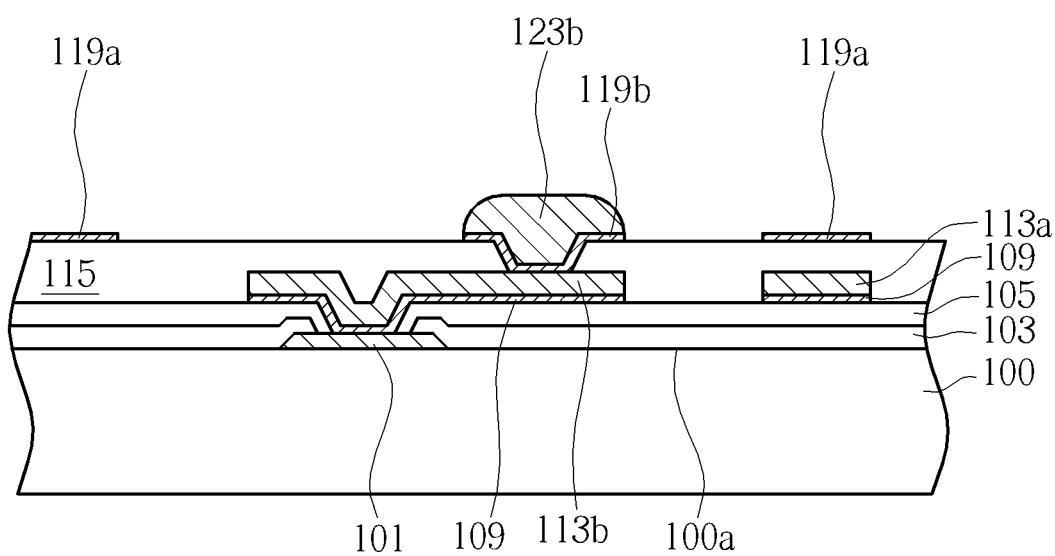
Figure 14:
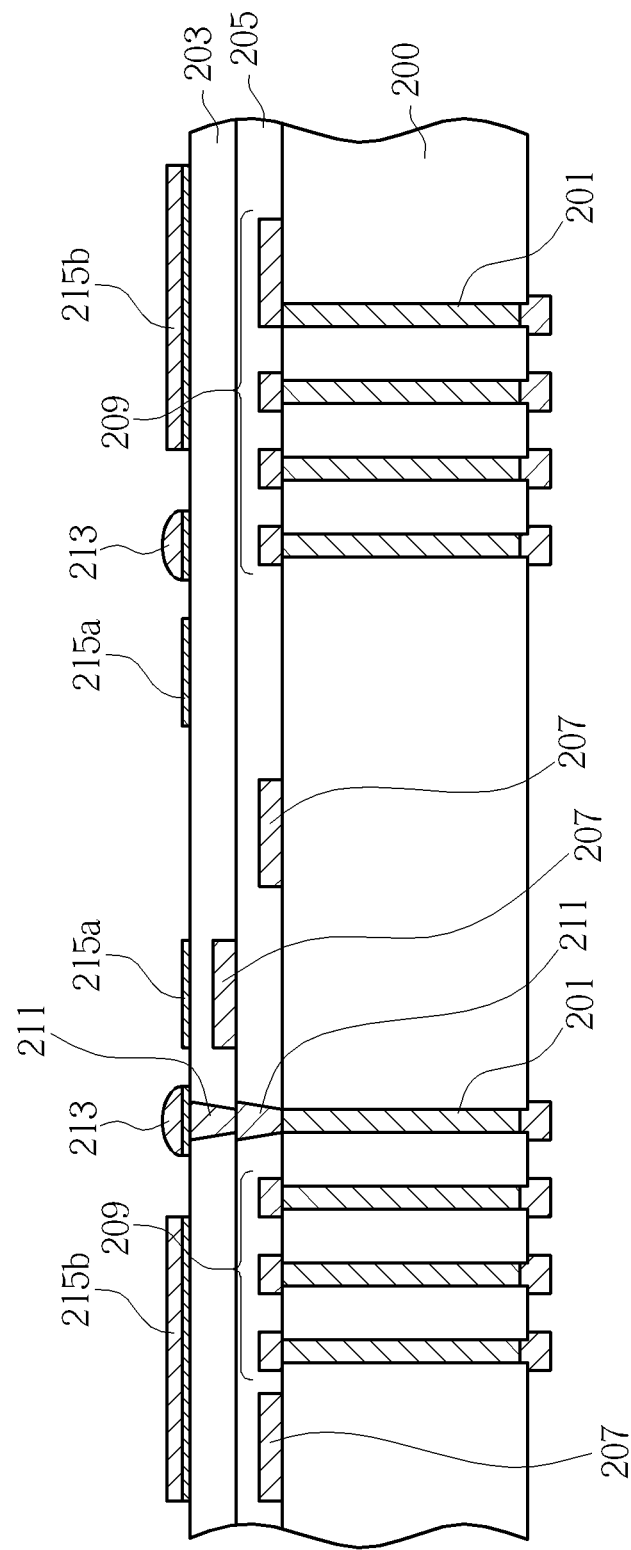
FIG. 14 is a cross-sectional view illustrating a substrate with integrated passive devices formed in redistribution layers and in an under bump metal in accordance with the first embodiment of the present invention.

The embodiments will now be explained with reference to the accompanying drawings to provide a better understanding of the process of the present invention, wherein FIGS. 1-13 are cross-sectional views illustrating the process flow for manufacturing said substrate with integrated passive devices, and FIG. 14 is a cross-sectional view illustrating an exemplary substrate with integrated passive devices manufactured through the process flow shown in FIGS. 1-13.

First, please refer to FIG. 1, a substrate 100 (ex. a wafer) is provided with an I/O pad 101, such as an Al pad, formed thereon. The I/O pad 101 is electrically connected to the interconnection circuits (ex. a top metal layer or a through silicon via (TSV)) inside the substrate 100 and is designed to be connected to an outer redistribution layer (RDL) for re-routing the positions of bond pads on the substrate. Alternatively, the substrate 100 may also be an interposer (ex. a substrate with through silicon vias (TSV) penetrating therethrough), like in the embodiment shown in FIG. 14. In this application, each I/O pad 101 is connected to a TSV in the substrate instead of interconnection circuits. In the embodiment of present invention, the substrate 100 may be attached on a carrier (not shown) and the whole manufacturing process is performed on the backside 100a of the substrate. The interconnection circuits and the TSV inside the substrate 100 will not be shown in FIG. 1 and other figures for purposes of clarity.

In the embodiment of present invention, the substrate 100 may be a substrate suitable for thin-film processes and TSV processes, such as a silicon substrate, a glass substrate, a GaAs & sapphire ($Al_2O_3$) substrate, silicon-on-insulator (SOI), or even a chip or a Si interposer. The thin-film process is necessary in the present invention to manufacture integrated passive devices (IPD) on the substrate 100. The TSV process may be performed to connect multiple stacked substrates 100 for constructing a 3D-IC architecture by using, for example, wafer level package (WLP) technology.

Please refer again to FIG. 1. A nitride passivation 103 overlaps and seals the edges of the I/O pad 101, and a dielectric layer 105 is deposited over the nitride passivation 103. A part of the I/O pad 101 is exposed from the dielectric layer 105 through an opening 107. The opening 107 may be formed through a regular photolithographic processes including, for example, exposure and developing steps. In the embodiment of present invention, the material of the dielectric layer 105 may be polyimide (PI), poly-phenylene benzobisoxazole (PBO) or benzocyclobutene (BCB). The use of PI, PBO or BCB material can improve the stress relief of the redistribution layers (RDL) that will be formed on the dielectric layer 105 in following processes. An additional curing process may be performed to cure the deposited dielectric layer 105.

Figure 2:
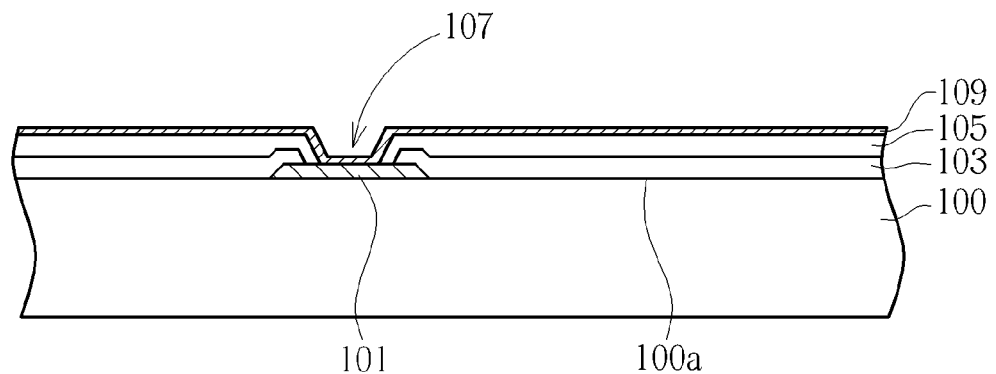

Subsequently, as shown in FIG. 2, a metallization layer 109 is formed on the substrate 100 to serve as a pre-layer for plating the RDL patterns. The metallization layer 109 may be conformally formed on the substrate 100 through magnetron sputtering, e-beam evaporation, or electroless plating processes. The metallization layer 109 is electrically connected with the underlying I/O pad 101 through the opening 107 of the dielectric layer 105. In the embodiment of present invention, the metallization layer 109 may be a film stack including Cr/CrCu/Cu, Ti(W)/Cu/Ni, Al/NiV/Cu or Ni/Au, which can meet the needs of adhesion, barrier, conductor, and protection properties.

Figure 3:
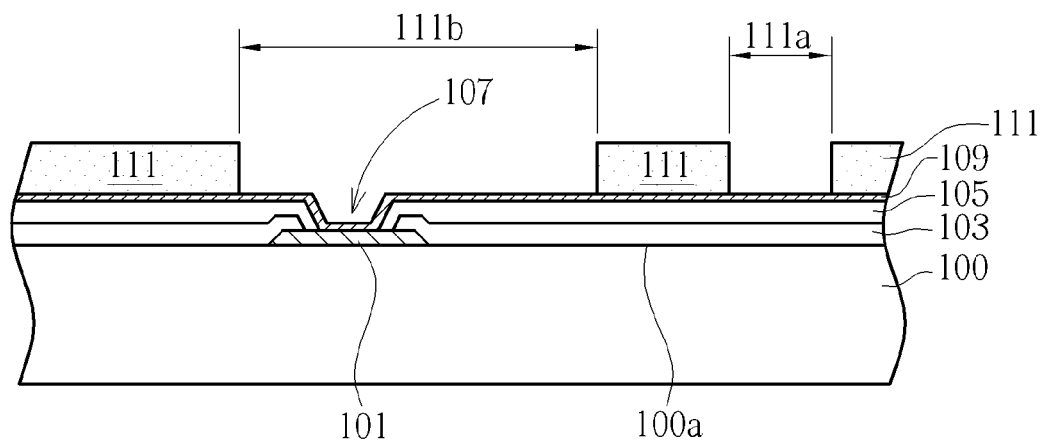

After the metallization layer 109 is formed, as shown in FIG. 3, a patterned photoresist layer 111 is coated on the metallization layer 109. The photoresist layer 111 serves as a block layer to prevent the formation of RDL patterns on undesired areas of the substrate 100 in following plating processes. In the embodiment of present invention, the photoresist layer 111 includes a 1st IPD pattern 111a, a RDL trace pattern 111b and/or stacked via patterns (not shown), which may be obtained through a regular photo-lithographic process. These patterns 111a, 111b are shown as the openings of photoresist layer 111 which expose the underlying metallization layer 109 in FIG. 3. Thanks to the blocking of the photoresist layer 111, desired patterns of conductive materials (ex. Cu or Au) for RDL may be readily formed on the metallization layer 109.

Figure 4:
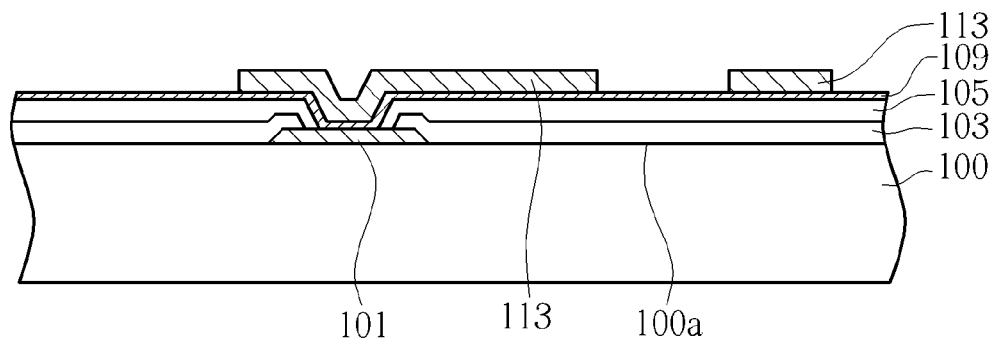

Thereafter, as shown in FIG. 4, an electroplating process is carried out to form a RDL layer 113 on the exposed metallization layer 109 in the patterns 111a and 111b of the photoresist layer 111. In this figure, the photoresist layer 111 has already been removed after the plating process and exposes the underlying metallization layer 109. However, at this stage, the patterns of the RDL layer 113 are still connected by the metallization layer 109. To form individual RDL patterns, the exposed metallization layer 109 should be disconnected.

Figure 5:
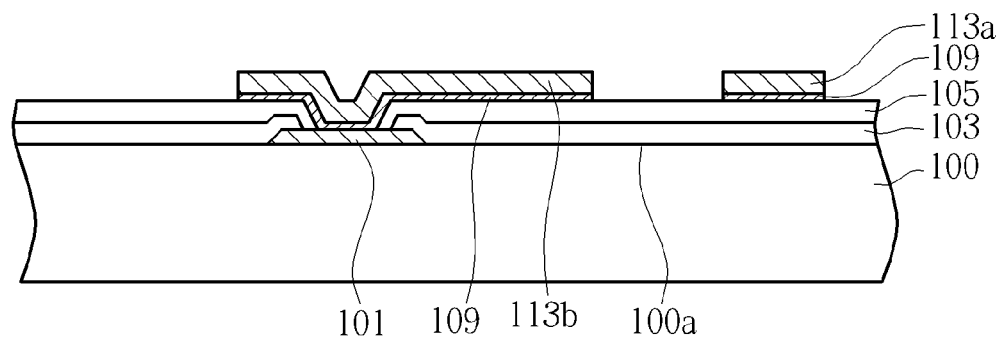

Therefore, as shown in FIG. 5, a wet etching process is performed to remove the exposed metallization layer 109. The removal of the exposed metallization layer 109 divides the patterns of the RDL layer 113 into several individual conductive patterns, such as a 1st IPD 113a, RDL traces 113b or stacked vias (not shown). From a commodity technology initially developed to replace bulky discrete passive components, thin-film IPD are now a growing industry with a trend driven by ESD/EMI protections, RF, High brightness LEDs, and digital & mixed signal applications. The 1st IPD 113a may be a passive device with the above-mentioned functions, such as a resistor, a capacitor, an inductor, a balun, a filter or a diplexer. In the embodiment of present invention, the 1st IPD 113a is formed concurrently with the RDL traces 113b during the RDL process. This design may facilitate the manufacture of the IPD on the substrate with a thin-film technology. No additional layers or processes are required for forming the IPD in the present invention.

Figure 6:
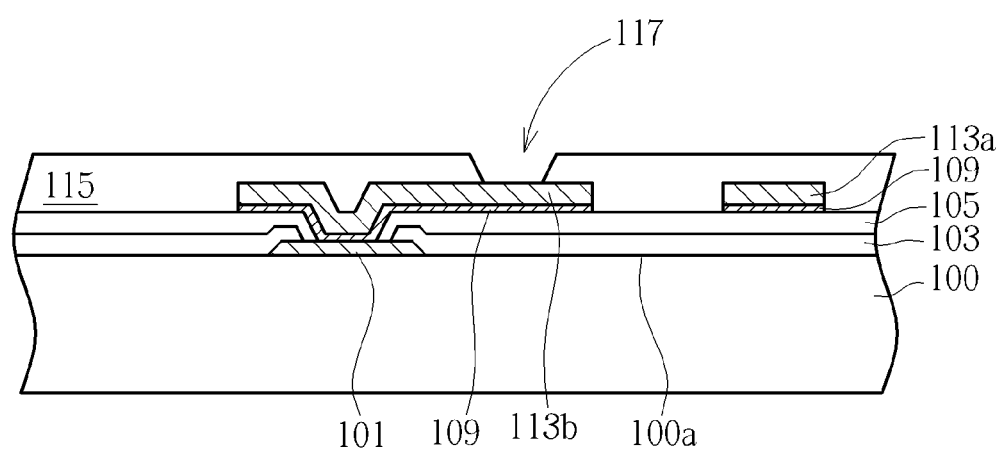

After the IPD 113a and RDL traces 113b are formed, as shown in FIG. 6, a dielectric layer 115 is formed on the substrate 100. A part of the RDL traces 113b is exposed from the dielectric layer 115 through an opening 117. Similar to FIG. 1, the opening 117 may be formed through regular photolithographic processes including, for example, exposure and developing steps. The material of dielectric layer 115 may be polyimide (PI), poly-phenylene benzobisoxazole (PBO) or benzocyclobutene (BCB).

Figure 7:
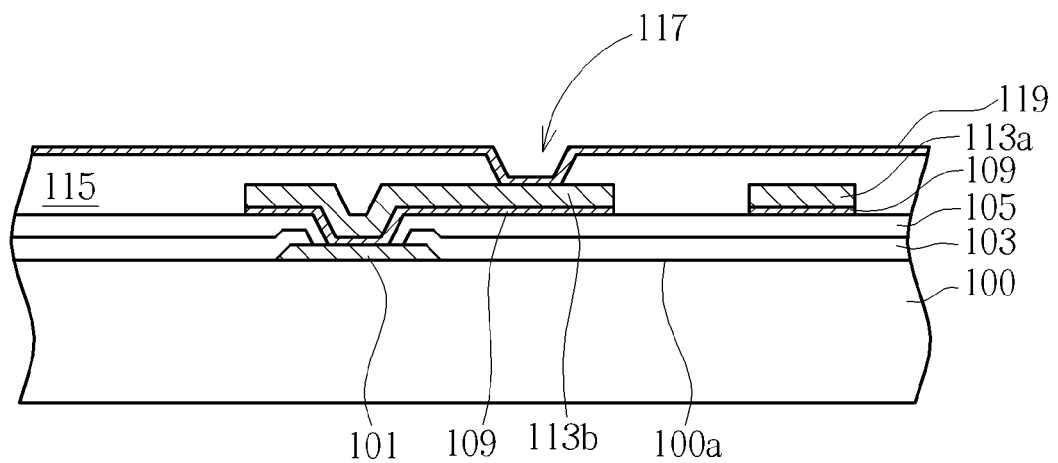

The re-routing RDL trace 113b is designed to be connected to an outer bump. For this purpose, an under ball metallization (UBM) layer is needed to serve as an interface between the solder bump and the RDL trace 113b. As shown in FIG. 7, a UBM layer 119 is formed on the substrate 100. The UBM layer 119 may be conformally formed on the substrate 100 through magnetron sputtering, e-beam evaporation, or electroless plating processes. The UBM layer 119 is electrically connected to the underlying RDL trace 113b through the opening 117 of the dielectric layer 115. Similar to the metallization layer 109, in the present invention, the UBM layer 119 may be a film stack including materials such as Cr/CrCu/Cu, Ti(W)/Cu/Ni, Al/NiV/Cu or Ni/Au, which can meet the needs of adhesion, barrier, conductor, and protection properties.

Figure 8:
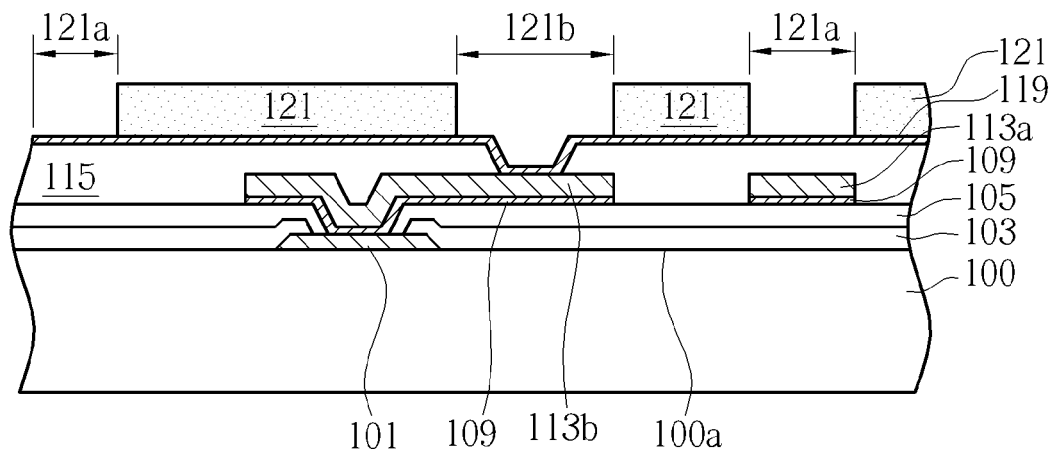

After the UBM layer 119 is formed on the substrate, as shown in FIG. 8, a patterned photoresist layer 121 is coated on the UBM layer 119. In the embodiment of present invention, the photoresist layer 121 serves as a block layer to prevent the formation of bumps or IPD on undesired areas of the substrate 100. The photoresist layer 111 includes two 2nd IPD patterns 121a and a bump pattern 121b, which may be formed through a regular photolithographic process. These patterns 121a, 121b serve as the openings of photoresist layer 121 and expose the underlying UBM layer 119. Thanks to the blocking of photoresist layer 111, desired patterns of 2nd IPD and/or bump may be readily formed on the UBM layer 119.

Figure 9:
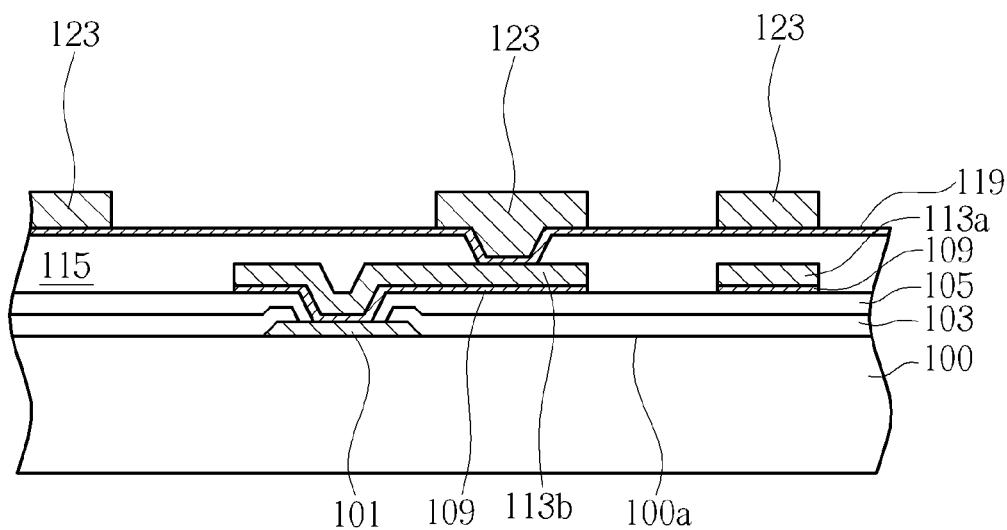

Thereafter, as shown in FIG. 9, a conductive layer 123 is filled into the patterns 121a, 121b of the photoresist layer 111. In the embodiment of present invention, the conductive layer 123 may be formed on the UBM layer 119 through e-beam evaporation, electroplating or printing processes. The material of the conductive layer 123 may be Sn/Pb, Cu or Au. In this figure, the photoresist layer 121 has already been removed after the conductive layer 123 is formed and exposes the underlying UBM layer 119. However, at this stage, the patterns of the 2nd IDP and bumps are still connected with the UBM layer 119. To form individual IDP patterns and bumps, the exposed UBM layer 119 should be disconnected.

Figure 10:
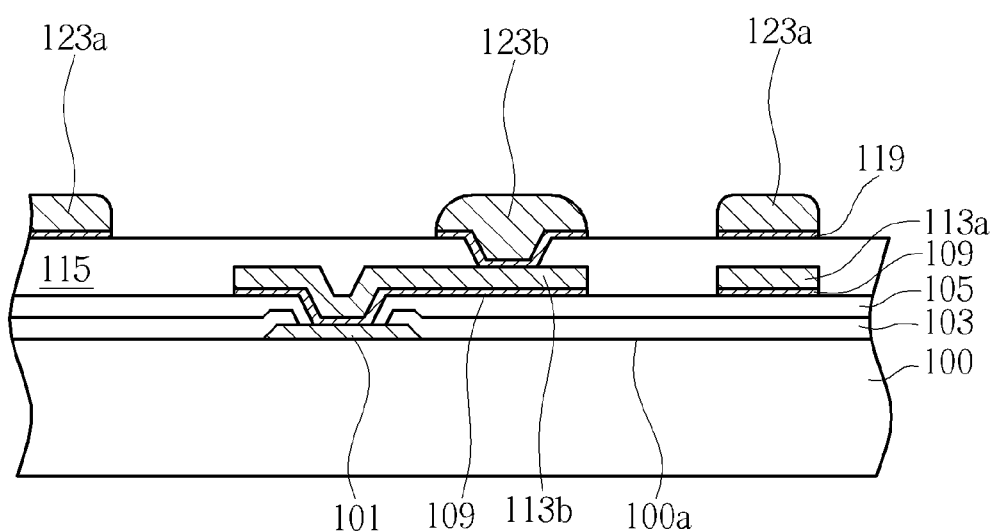
Figure 11:
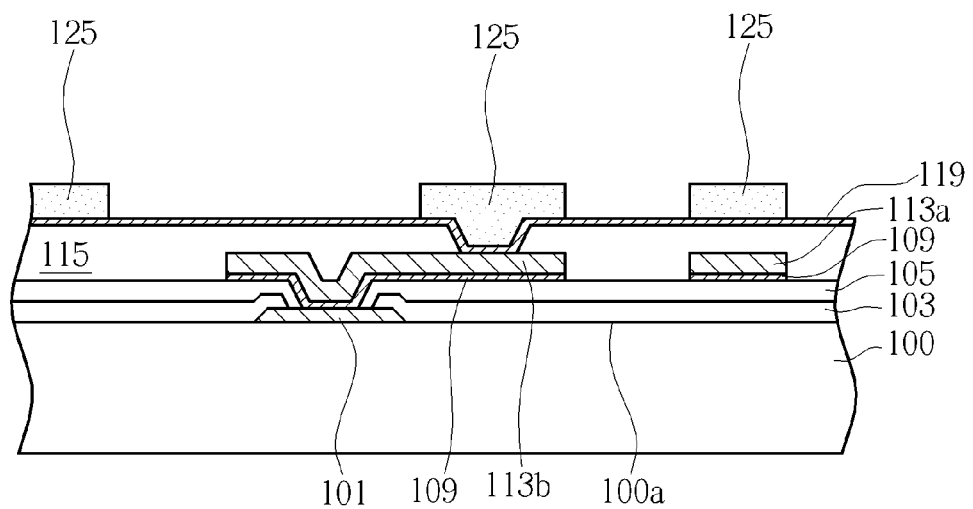

Therefore, as shown in FIG. 10, a wet etching process is performed using the conductive layer 123 as a mask to remove the exposed UBM layer 119. The removal of the exposed UBM layer 119 divides the patterns of the conductive layer 123 into a 2nd IPD 123a and a bump 123b. The 2nd IPD 123a may be a passive device such as a resistor, a capacitor, an inductor, a balun, a filter or a diplexer. A final reflow process is then performed to shape the bump 123b. The bump 123b may be a solder bump, a micro bump or a C4 bump.

In the embodiment of present invention, the 2nd IPD 123a is formed concurrently with the solder bump 123b. This design may facilitate the manufacturing process of the IPD on the substrate. No additional layers or processes are required to form the IPD in this invention. Furthermore, the 2nd IPD 123a on UBM layer 119 may cooperate or correspond with the underlying 1st IPD 113a in RDL layer. For example, in this embodiment, the right 2nd IPD 123a on the UBM layer 119 overlaps the 1st IPD 113a, thus the 1st IPD 113a, the dielectric layer 115 and the 2nd IPD 123a may constitute a capacitor passive device. Alternatively, the 2nd IPD 123a on UBM layer 119 may be an individual IPD pattern. For example, the left 2nd IPD 123a doesn't correspond to any IPD pattern in the underlying RDL layer.

Figure 12:
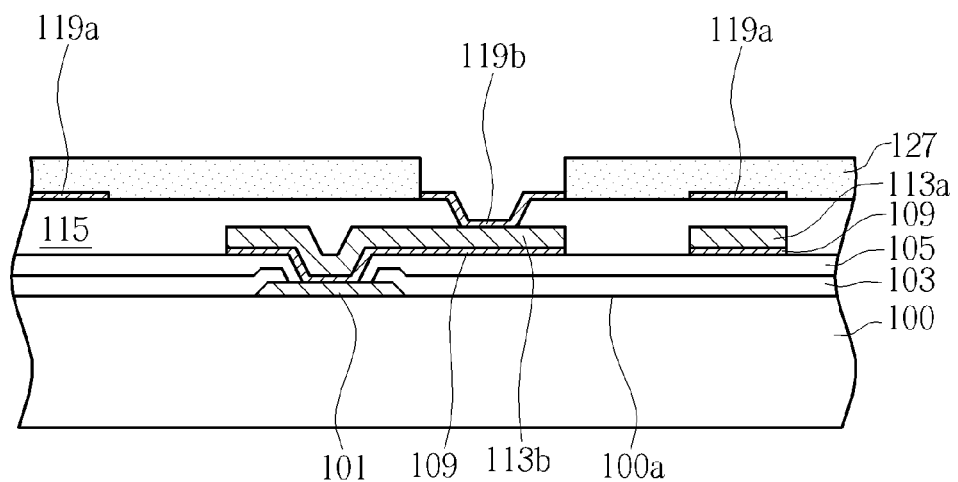

Alternatively, in another embodiment of the present invention, the 2nd IPD may be formed by the patterning of original UBM layer 119 instead of by filling the bump material into the patterns. In this embodiment, please refer to FIG. 11, when the UBM layer 119 is formed on the substrate (as shown in FIG. 7), a patterned 1st photoresist layer 125 is coated on the UBM layer 119. The predetermined areas for forming the 2nd IPD and the solder bump are covered by the 1st photoresist layer 125, and the exposed UBM layer 119 is then removed through a wet etching process using the 1st photoresist layer 125 as a mask. This etching process divides the UBM layer 119 into a thin 2nd IPD 119a and a bump portion 119b, as shown in FIG. 12. The patterned 2nd IPD 119a is then covered by a 2nd photoresist layer 127 which exposes only the bump portion 119b of the UBM layer. The following process is similar to the steps shown in FIGS. 9-10. A conductive layer is formed on the bump portion 119b and is ref lowed into a solder bump 123b, as shown in FIG. 13. Similar to the embodiment shown in FIG. 10, the 2nd IPD 119a of UBM layer 119 may or may not cooperate or correspond to the 1st IPD pattern 113a of the underlying RDL layer.

In the present invention, the IPD components or patterns can be easily manufactured through RDL process, UBM process, and/or bump filling process in a regular process flow. Furthermore, since the IPD patterns are formed in the RDL layer, the UBM layer and/or the bump layer, the overall product size is not increased.

Please refer now to FIG. 14. A substrate with integrated passive devices formed in RDL layers and an UBM layer is shown according to the preferred embodiment of present invention. As shown in FIG. 14, a substrate 200 is provided with multiple through silicon vias (TSV) 201 penetrating therethrough. The TSV 201 may be formed by first performing a laser drilling or a deep reactive ion etching (DRIE) process on the substrate 200 to form through holes, and then the through holes are filled up with conductive materials, such as Cu or W, to form TSV conductors. The TSV 201 may include other components, such as an isolation layer, a barrier layer and/or a seed layer. Those additional components are omitted in the figures, for the simplicity and clarity of the description of the present invention.

Please refer again to FIG. 14. In this embodiment of present invention, at least one dielectric layer (ex. 203 and 205) is formed on the substrate 200. Each dielectric layer 203, 205 may include a RDL layer which is electrically connected to the TSV 201, wherein the RDL layer is composed of a 1st IPD 207 and RDL traces 209. The dielectric layers 203, 205 may also include stacked vias 211 which are connected directly to the overlying solder bump 213. The stacked vias 211 may make the TSV 201 longer so as to facilitate the connection of the TSV 201 to other dice on the substrate. A plurality of 2nd IPDs are formed on the topmost dielectric layer 205, wherein the 2nd IPDs may be formed only from the UBM layer, such as a 2nd IPD 215a, or the 2nd IPD may be formed by the bump filling material on the UBM layer, such as a 2nd IPD 215b, That is, the 2nd IPD 215b includes an upper bump layer and a lower UBM layer. For present invention, the IPD pattern formed in/on the UBM level, such as the 2nd IPDs 215a, 215b, may or may not overlap the IPD pattern formed in the RDL levels, such as the 1st IPD 207.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A substrate with integrated passive devices, comprising:
 a substrate;
 at least one dielectric layer formed on said substrate;
 a redistribution layer formed on said at least one dielectric layer;

a topmost dielectric layer formed on said at least one dielectric layer and said redistribution layer;

an under bump metal layer formed directly on said topmost dielectric layer, wherein said under bump metal layer comprises a first integrated passive device pattern; and bumps formed directly on said under bump metal layer.

2. The substrate with integrated passive devices according to claim 1, wherein said redistribution layer comprises a second integrated passive device pattern, redistribution traces and stacked vias.

3. The substrate with integrated passive devices according to claim 2, wherein said first integrated passive device pattern and said second integrated passive device pattern comprise resistors, capacitors, inductors, baluns, filters or diplexers.

4. The substrate with integrated passive devices according to claim 1, wherein said first integrated passive device pattern comprises under bump metal and bump metal.

5. The substrate with integrated passive devices according to claim 1, wherein said redistribution layer is electrically connected to a through silicon via in said substrate.

6. The substrate with integrated passive devices according to claim 1, wherein said at least one dielectric layer, said redistribution layer and said under bump metal layer are formed on the backside of said substrate.

7. The substrate with integrated passive devices according to claim 1, wherein the material of said at least one dielectric layer comprises polyimide (PI), poly-phenylene benzobisoxazole (PBO) or benzo-cyclobutene (BCB).

8. The substrate with integrated passive devices according to claim 1, wherein said substrate is a wafer level package substrate.

9. The substrate with integrated passive devices according to claim 1, wherein said bumps are solder bumps, micro bumps or C4 bumps.

10. The substrate with integrated passive devices according to claim 1, wherein the material of said under bump metal layer is different from the material of said redistribution layer.

11. A substrate with integrated passive devices, comprising:

a substrate;

at least one dielectric layer formed on said substrate;

a redistribution layer formed on said at least one dielectric layer, wherein said redistribution layer comprises a first integrated passive device pattern, redistribution traces and stacked vias;

a topmost dielectric layer formed on said at least one dielectric layer and said redistribution layer;

an under bump metal layer formed directly on said topmost dielectric layer, wherein said under bump metal layer comprises a second integrated passive device pattern; and bumps formed directly on said under bump metal layer.

12. The substrate with integrated passive devices according to claim 11, wherein said at least one dielectric layer, said redistribution layer and said under bump metal layer are formed on the backside of said substrate.

13. The substrate with integrated passive devices according to claim 11, wherein the material of said at least one dielectric layer comprises polyimide (PI), poly-phenylene benzobisoxazole (PBO) or benzo-cyclobutene (BCB).

14. The substrate with integrated passive devices according to claim 11, wherein said first integrated passive device pattern and said second integrated passive device pattern comprise resistors, capacitors, inductors, baluns, filters or diplexers.

15. The substrate with integrated passive devices according to claim 11, wherein said bumps are solder bumps, micro bumps or C4 bumps.

16. The substrate with integrated passive devices according to claim 11, wherein the material of said under bump metal layer is different from the material of said redistribution layer.

* * * * *